(12) United States Patent
Saha (10) Patent No.: US 10,794,970 B2
(45) Date of Patent: Oct. 6, 2020

(54) STAGGERED PARALLEL TRANSMISSION RADIO FREQUENCY COIL FOR MAGNETIC RESONANCE IMAGING

(71) Applicant: General Electric Company, Schenectady, NY (US)

(72) Inventor: Saikat Saha, Pewaukee, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 376 days.

(21) Appl. No.: 15/645,984

(22) Filed: Jul. 10, 2017

(65) Prior Publication Data
US 2019/0011508 A1 Jan. 10, 2019

(51) Int. Cl.
| | |
|---|---|
| G01R 33/34 | (2006.01) |
| G01R 33/341 | (2006.01) |
| G01R 33/36 | (2006.01) |
| G01R 33/3815 | (2006.01) |
| G01R 33/3415 | (2006.01) |
| G01R 33/422 | (2006.01) |

(52) U.S. Cl.
CPC ..... G01R 33/34092 (2013.01); G01R 33/341 (2013.01); G01R 33/34007 (2013.01); G01R 33/3415 (2013.01); G01R 33/34046 (2013.01); G01R 33/36 (2013.01); G01R 33/3815 (2013.01); G01R 33/422 (2013.01)

(58) Field of Classification Search
None
See application file for complete search history.

(56) References Cited

U.S. PATENT DOCUMENTS

| | | | | |
|---|---|---|---|---|
| 5,565,778 A | * | 10/1996 | Brey | G01R 33/34 324/318 |
| 5,594,342 A | * | 1/1997 | Brey | G01R 33/34 324/318 |
| 7,227,360 B2 | | 6/2007 | Jevtic et al. | |
| 7,990,146 B2 | | 8/2011 | Lazar et al. | |
| 8,030,926 B2 | | 10/2011 | Avdievich et al. | |
| 8,035,384 B2 | | 10/2011 | Saha | |
| 9,429,634 B2 | | 8/2016 | Crozier et al. | |
| 2008/0111550 A1 | | 5/2008 | Freytag | |
| 2012/0286921 A1 | | 11/2012 | Wang et al. | |
| 2014/0125339 A1 | | 5/2014 | Lee et al. | |
| 2014/0253127 A1 | * | 9/2014 | Leussler | G01R 33/34046 324/322 |
| 2015/0130467 A1 | | 5/2015 | Biber et al. | |
| 2015/0253393 A1 | | 9/2015 | Harvey | |

FOREIGN PATENT DOCUMENTS

WO 2013/054235 A1 4/2013

OTHER PUBLICATIONS

Extended European Search Report issued in connection with corresponding EP Application No. 18180410.5 dated Nov. 27, 2018, 8 pages.

* cited by examiner

*Primary Examiner* — Paresh Patel
(74) *Attorney, Agent, or Firm* — McCoy Russell LLP (57) ABSTRACT

Methods and systems are provided for radio frequency (RF) coils for magnetic resonance imaging (MRI) systems. In one embodiment, an RF coil configured for an MRI system comprises a plurality of RF coil conductors, each RF coil conductor comprising a base side with two arms extending therefrom. In this way, the RF coil may efficiently generate magnetic fields with improved channel isolation while producing fewer annefact artifacts.

15 Claims, 5 Drawing Sheets

STAGGERED PARALLEL TRANSMISSION RADIO FREQUENCY COIL FOR MAGNETIC RESONANCE IMAGING

FIELD

Embodiments of the subject matter disclosed herein relate to magnetic resonance imaging (MRI), and more particularly, to staggered parallel transmission radio frequency (RF) coils for MRI.

BACKGROUND

Magnetic resonance imaging (MRI) is a medical imaging modality that can create pictures of the inside of a human body without using x-rays or other ionizing radiation. MRI uses a superconducting magnet to create a strong, uniform, static magnetic field. When a human body, or part of a human body, is placed in the magnetic field, the nuclear spins associated with the hydrogen nuclei in tissue water become polarized, wherein the magnetic moments associated with these spins become preferentially aligned along the direction of the magnetic field, resulting in a small net tissue magnetization along that axis. MRI systems also include gradient coils that produce smaller-amplitude, spatially-varying magnetic fields with orthogonal axes to spatially encode the MR signal by creating a signature resonance frequency at each location in the body. Radio frequency (RF) coils are then used to create pulses of RF energy at or near the resonance frequency of the hydrogen nuclei, which add energy to the nuclear spin system. As the nuclear spins relax back to their rest energy state, they release the absorbed energy in the form of an RF signal. This signal is detected by the MRI system and is transformed into an image using a computer and known reconstruction algorithms.

Some RF coils may be configured for parallel transmission, wherein the RF coil includes separate independently powered and controlled elements that each produce their own magnetic subfields which sum to constitute a net magnetic field, in contrast with RF coils that only generate a single magnetic field. Parallel transmission thus enables the selective control of the homogeneity of RF excitation as well as the distribution of magnetic and electric fields produced in the tissue.

However, most parallel transmission RF coils used for MRI, such as transverse electromagnetic (TEM) coils, degenerate birdcage coils, and loop coils feature significant RF performance issues. For example, TEM coils inefficiently generate magnetic fields and produce more annefact artifacts than other coils. Loop coils are also inefficient for generating magnetic fields. Degenerate birdcage coils are sensitive to the shield location and isolation between channels is limited.

BRIEF DESCRIPTION

In one embodiment, a radio frequency (RF) coil configured for a magnetic resonance imaging (MRI) system comprises a plurality of RF coil conductors, each RF coil conductor comprising a base side with two arms extending therefrom. In this way, the RF coil may efficiently generate magnetic fields with improved channel isolation while producing fewer annefact artifacts.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIGS. 2-3 are shown approximately to scale.

DETAILED DESCRIPTION

Figure 2:
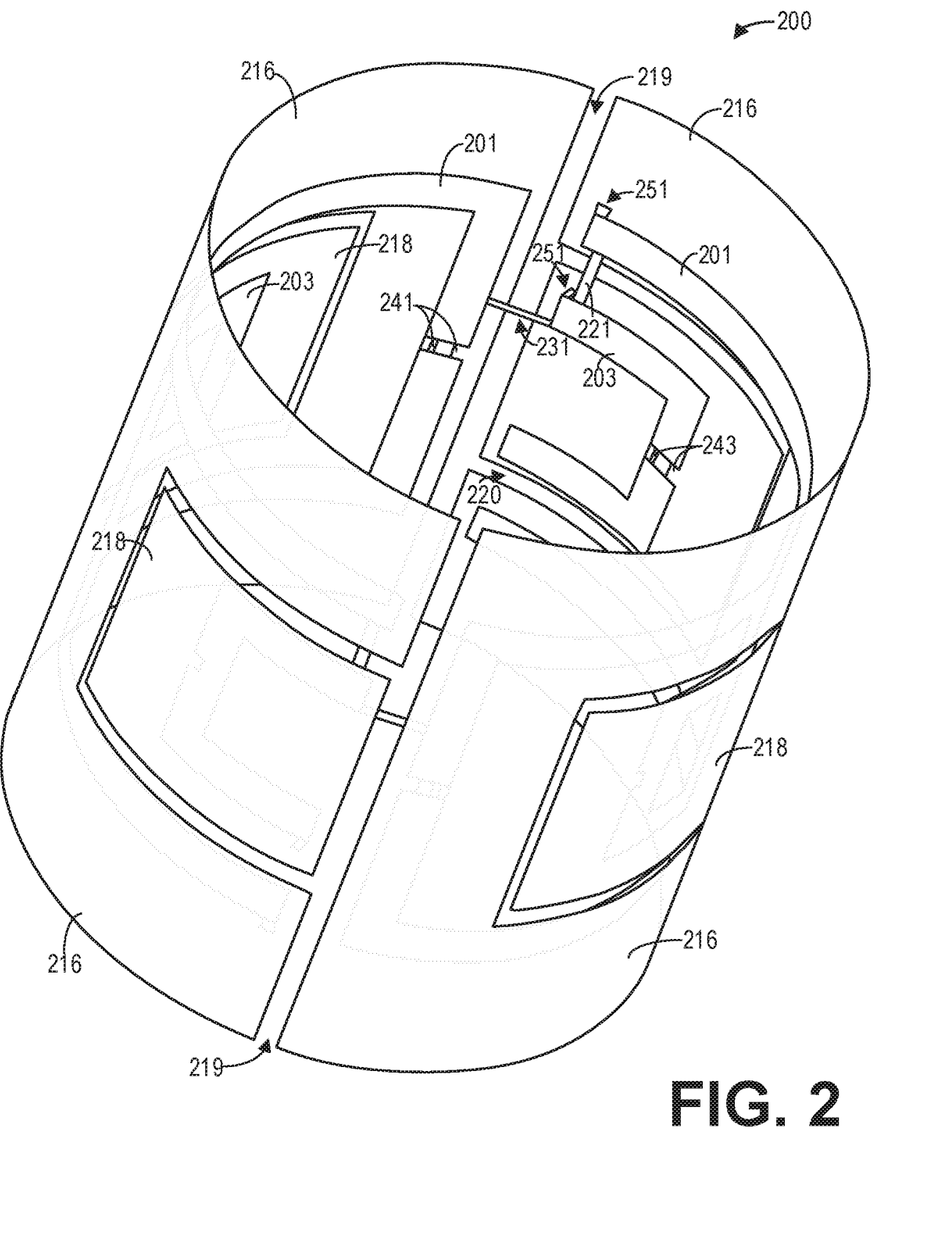
FIG. 2 shows a perspective view of an example RF coil according to an embodiment.
Figure 3:
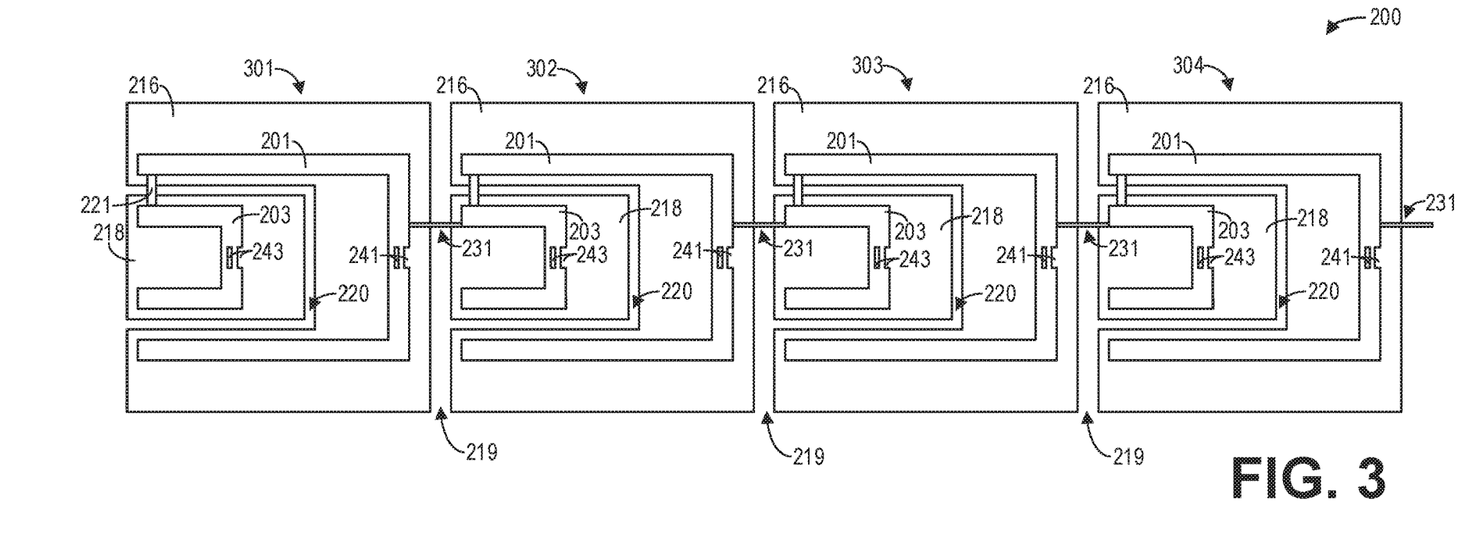
FIG. 3 shows a two-dimensional projection of the example RF coil depicted in FIG. 2.
Figure 6:
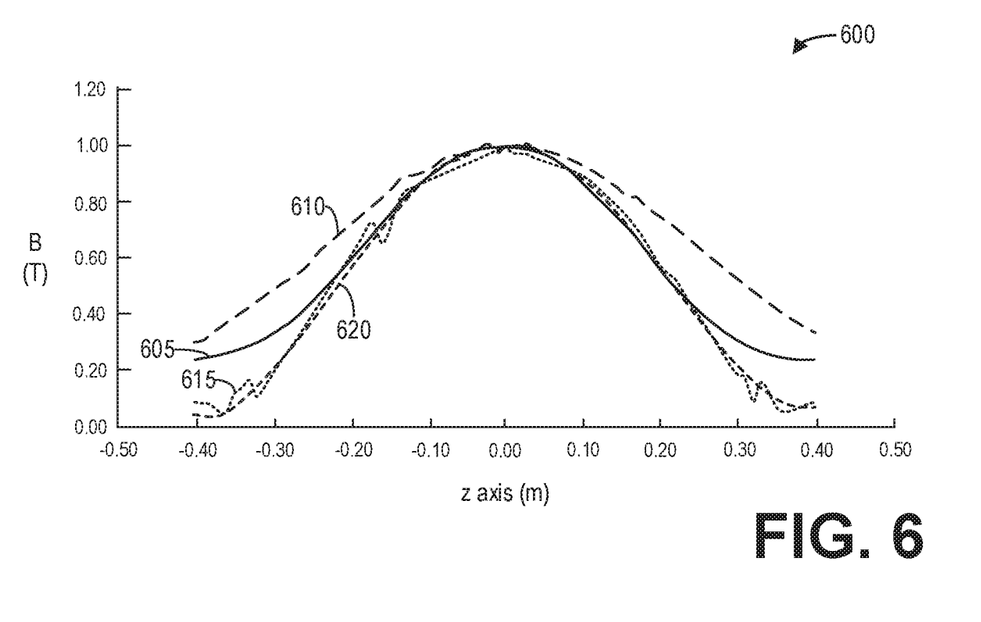
FIG. 6 shows a graph illustrating magnetic field strength as a function of axial position for different RF coils.

The following description relates to various embodiments of an RF coil in MRI systems. In particular, systems are provided for a staggered loop RF coil that may be implemented in an MRI system, such as the MRI system depicted in FIG. 1. A staggered loop RF coil may include a plurality of RF coil conductors configured in a "U" shape and arranged in a staggered configuration, as depicted in FIGS. 2 and 3. The arms of the RF coil conductors may be configured in an obtuse or an acute configuration (i.e., the arms of the conductors may extend at angles greater than or less than ninety degrees from a base side of the conductors) rather than a right configuration (i.e., the arms extend at a ninety degree angle from the base side of the conductors). The field strength of a staggered loop RF coil is comparable to the strength of a TEM coil and improved with respect to birdcage and loop RF coils, as depicted in FIG. 6, while exhibiting significant performance improvements (e.g., efficiency, annefact, and channel isolation) over each other RF coil configuration.

Figure 1:
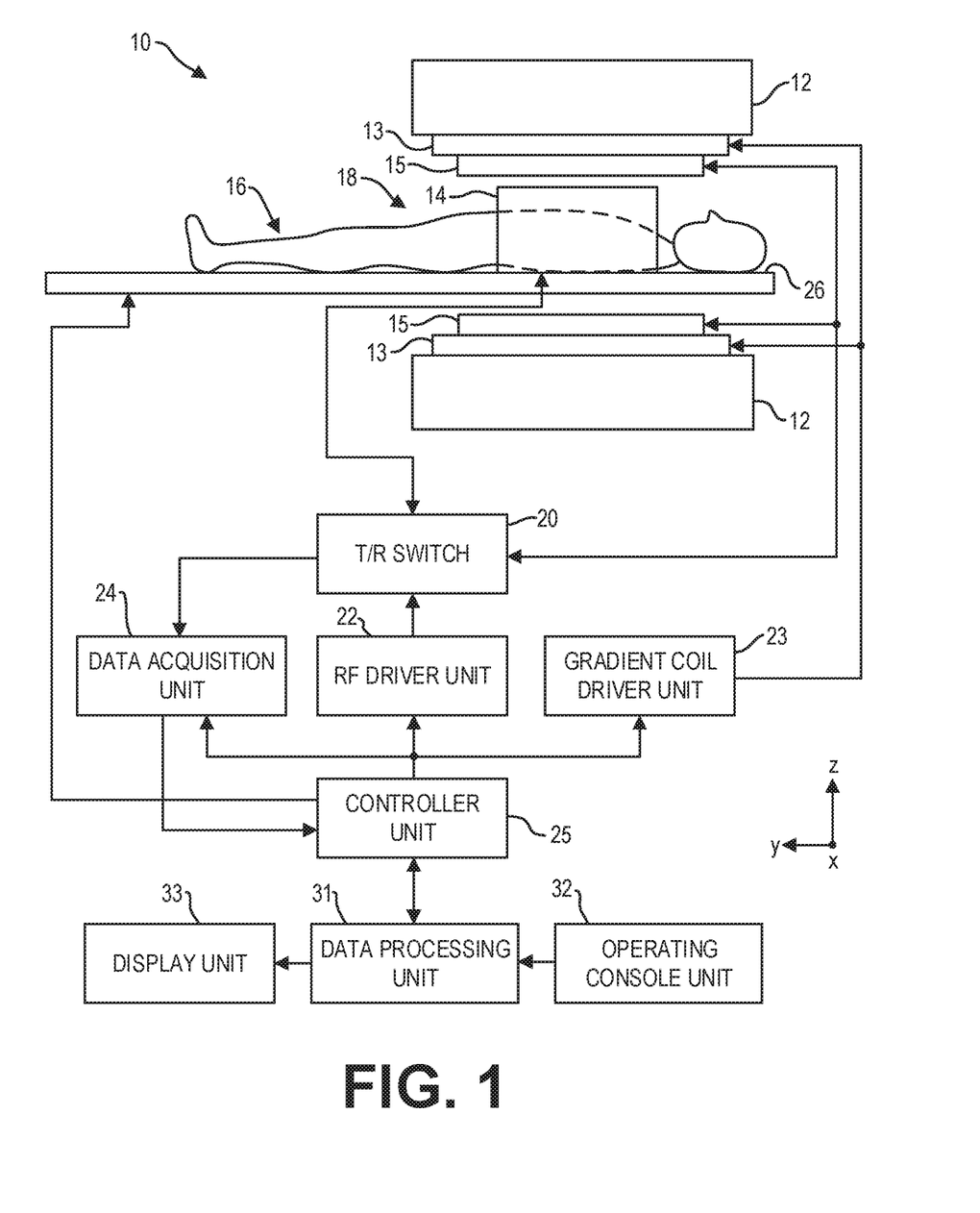
FIG. 1 is a block diagram of an MRI system according to an embodiment of the invention.

FIG. 1 illustrates a magnetic resonance imaging (MRI) apparatus 10 that includes a magnetostatic field magnet unit 12, a gradient coil unit 13, an RF coil unit 14, an RF body coil unit 15, a transmit/receive (T/R) switch 20, an RF driver unit 22, a gradient coil driver unit 23, a data acquisition unit 24, a controller unit 25, a patient bed 26, a data processing unit 31, an operating console unit 32, and a display unit 33. The MRI apparatus 10 transmits electromagnetic pulse signals to a subject 16 placed in an imaging space 18 with a magnetostatic field formed to perform a scan for obtaining magnetic resonance (MR) signals from the subject 16 to reconstruct an image of a slice of the subject 16 based on the MR signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field along the Z direction of the cylinder space.

The MRI apparatus 10 also includes the gradient coil unit 13 that generates a gradient magnetic field in the imaging space 18 so as to provide the MR signals received by the RF coil unit 14 with three-dimensional positional information. The gradient coil unit 13 includes three gradient coil systems, each of which generates a gradient magnetic field which includes into one of three spatial axes perpendicular to each other, and generates a gradient field in each frequency-encoding direction, phase-encoding direction, and slice-selection direction in accordance with the imaging condition. More specifically, the gradient coil unit 13 applies a gradient field in the slice-selection direction of the subject 16, to select the slice; and the RF coil unit 14 transmits an RF pulse to a selected slice of the subject 16 and excites it. The gradient coil unit 13 also applies a gradient field in the phase-encoding direction of the subject 16 to phase encode the MR signals from the slice excited by the RF pulse. The gradient coil unit 13 then applies a gradient field in the frequency-encoding direction of the subject 16 to frequency encode the MR signals from the slice excited by the RF pulse.

The RF coil unit 14 is disposed, for example, to enclose the region to be imaged of the subject 16. In the static magnetic field space or imaging space 18 where a static magnetic field is formed by the magnetostatic field magnet unit 12, the RF coil unit 14 transmits, based on a control signal from the controller unit 25, an RF pulse that is an electromagnetic wave to the subject 16 and thereby generates a high-frequency magnetic field. This excites a spin of protons in the slice to be imaged of the subject 16. The RF coil unit 14 receives, as an MR signal, the electromagnetic wave generated when the proton spin thus excited in the slice to be imaged of the subject 16 returns into alignment with the initial magnetization vector. The RF coil unit 14 may transmit and receive an RF pulse using the same RF coil.

The RF body coil unit 15 is disposed, for example, to enclose the imaging space 18, and produces RF magnetic field pulses orthogonal to the main magnetic field produced by the magnetostatic field magnet unit 12 within the imaging space 18 to excite the nuclei. In contrast to the RF coil unit 14, which may be easily disconnected from the MR apparatus 10 and replaced with another RF coil unit, the RF body coil unit 15 is fixedly attached and connected to the MRI apparatus 10. Furthermore, whereas local coils such as those comprising the RF coil unit 14 can transmit to or receive signals from only a localized region of the subject 16, the RF body coil unit 15 generally has a larger coverage area and can be used to transmit or receive signals to the whole body of the subject 16. Using receive-only local coils and transmit body coils provides a uniform RF excitation and good image uniformity at the expense of high RF power deposited in the subject 16. For a transmit-receive local coil, the local coil provides the RF excitation to the region of interest and receives the MR signal, thereby decreasing the RF power deposited in the subject 16. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in a receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode, a receive-only mode, or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coil unit 14 and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 14.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a preamplifier (not shown), a phase detector (not shown), and an analog/digital converter (not shown) used to acquire the MR signals received by the RF coil unit 14. In the data acquisition unit 24, the phase detector phase detects, using the output from the RF oscillator of the RF driver unit 22 as a reference signal, the MR signals received from the RF coil unit 14 and amplified by the preamplifier, and outputs the phase-detected analog MR signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as, as non-limiting examples, a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform pre-determined data processing is recorded. The data processing unit 31 is connected to the controller unit 25 and performs data processing based on control signals received from the controller unit 25. The data processing unit 31 is also connected to the data acquisition unit 24 and generates spectrum data by applying various imaging processing operations to the MR signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

FIG. 2 shows a perspective view of an RF coil 200 in accordance with an embodiment. In particular, RF coil 200 comprises an eight-channel staggered loop RF coil. As depicted, RF coil 200 is cylindrical and annular in shape and is compatible with the above-described MRI system 10 of FIG. 1 or any other similar or equivalent system for obtaining MR images.

RF coil 200 includes a plurality of outer RF coil conductors 201 and a plurality of inner RF coil conductors 203. The conductors 201 and 203 may be constructed from conventional materials with high electrical conductivity such as copper. For an eight-channel RF coil, the RF coil 200 may include four outer RF coil conductors 201 and four inner RF coil conductors 203. In some examples, each outer RF coil conductor 201 may be paired with a corresponding inner RF coil conductor 203 to form a coil segment.

As an illustrative example, FIG. 3 shows a two-dimensional projection of the interior of the example RF coil 200 depicted in FIG. 2. As shown in FIG. 3, the RF coil 200 includes a first coil segment 301, a second coil segment 302, a third coil segment 303, and a fourth coil segment 304. Each of the coil segments 301, 302, 303, and 304 includes an outer RF coil conductor 201 and an inner RF coil conductor 203.

Each of the RF coil conductors 201 and 203 are configured in an approximately "U" shape. That is, each of the RF coil conductors 201 and 203 may comprise a base side with two arms extending in a same direction from each end of the base side. The arms may be configured at right angles to the base side of the RF coil conductor as depicted in FIG. 2. As discussed further herein with regard to FIGS. 4 and 5, the arms may be configured at acute and/or obtuse angles relative to the base side of the RF coil conductor.

The dimensions of the outer RF coil conductors 201 are relatively larger than the dimensions of the inner RF coil conductors 203 such that the inner RF coil conductors 203 may be positioned within the space defined by the arms and base side of the outer RF coil conductors 201. Furthermore, as depicted in FIG. 2, the ends of the arms of an inner RF coil conductor 203 may be aligned with the ends of the arms of an outer RF coil conductor 201.

RF coil 200 further includes a plurality of outer shields 216 and a plurality of inner shields 218. Each RF coil conductor may be positioned on a corresponding shield. For example, each outer RF coil conductor 201 may be positioned on a corresponding outer shield 216, while each inner RF coil conductor 203 may be positioned on a corresponding inner shield 218. More specifically, the RF coil conductors 201 and 203 are positioned on an inner surface of the outer and inner shields 216 and 218, respectively. In this way, the shields 216 and 218 radially separates the RF coil conductors 201 and 203 from the gradient coils (e.g., gradient coil unit 13), such that the shields 216 and 218 function to decouple the RF coil conductors 201 and 203 from the gradient coils in the imaging system.

As depicted, the outer shields 216 may be configured in a "U" shape similar to the outer RF coil conductors 201. Meanwhile, the inner shields 218 may be configured as a curved sheet (e.g., as a rectangle as depicted in the two-dimensional projection illustrated in FIG. 3). The dimensions of the shields 216 and 218 may be relatively larger than the dimensions of the respective RF coil conductors 201 and 203. Further, the RF coil conductors 201 and 203 may be fixedly attached to the shields 216 and 218, respectively, via a plurality of support posts 251. The support posts 251 may support the RF coil conductors a specified distance away from the shields.

The outer RF coil conductors 201 and the inner RF coil conductors 203 may respectively include capacitor slots 241 and 243 wherein capacitors may be inserted to tune the RF coil conductors and thus the RF coil. It should be appreciated that RF coil 200 may include additional electronic components not shown, for example to couple the RF coil to a data acquisition unit and/or an RF driver unit.

Each pair of outer RF coil conductors 201 and inner RF coil conductors 203 may be connected via a connector 221. The inner RF coil conductor 203 of each pair of RF coil conductors may be connected, via a connector 231, to an outer RF coil conductor 201 of an adjacent pair of RF coil conductors.

The coil segments 301, 302, 303, and 304 of the RF coil 200 may be separated by gaps 219. That is, the coil segments may be spaced a specified distance apart from each other, thereby preventing common mode currents from occurring throughout the circumference of the RF coil. Furthermore, the outer shield 216 and the inner shield 218 of each coil segment may be similarly separated by a gap 220.

It should be appreciated that the eight-channel RF coil 200 as depicted is illustrative and non-limiting, and that in some examples the RF coil may include a number of channels greater than or less than eight. As one example, the RF coil 200 may comprise a four-channel RF coil. To that end, the RF coil 200 may include four outer RF coil conductors 201, with no inner RF coil conductors 203. Alternatively, the RF coil 200 may only include two coil segments, each including an outer RF coil conductor 201 and an inner RF coil conductor 203. In such an example, the dimensions of the RF coil conductors as well as the corresponding shields may be adjusted to provide the same dimensions as the RF coil 200. For example, the arms of each RF coil conductor may extend further than depicted. As another example, the RF coil 200 may include more than four coil segments. In such an example, the dimensions of each coil segment (comprising an outer RF coil conductor 201 and an inner RF coil conductor 203) may be adjusted to accommodate the additional coil segments.

RF coil 200 may be used for a whole-body RF coil or for a surface (or local) coil such as a head coil. For a whole-body RF coil, the dimensions of the RF coil 200 are configured so that the RF coil 200 can be mounted inside a gradient coil unit 13, as shown in FIG. 1, wherein the RF coil 200 is coaxial with the gradient coil unit 13. In such an example, the RF body coil unit 15 may comprise the RF coil 200. For a surface or local coil (e.g., a head coil), the dimensions of RF coil 200 are configured such that the RF coil 200 can be disposed within the patient imaging space 18 as shown in FIG. 1. In such an example, the RF coil unit 14 may comprise the RF coil 200. As another example, both the RF coil unit 14 and the RF body coil unit 15 may comprise a staggered loop RF coil such as the RF coil 200, with respectively configured dimensions.

Figure 4:
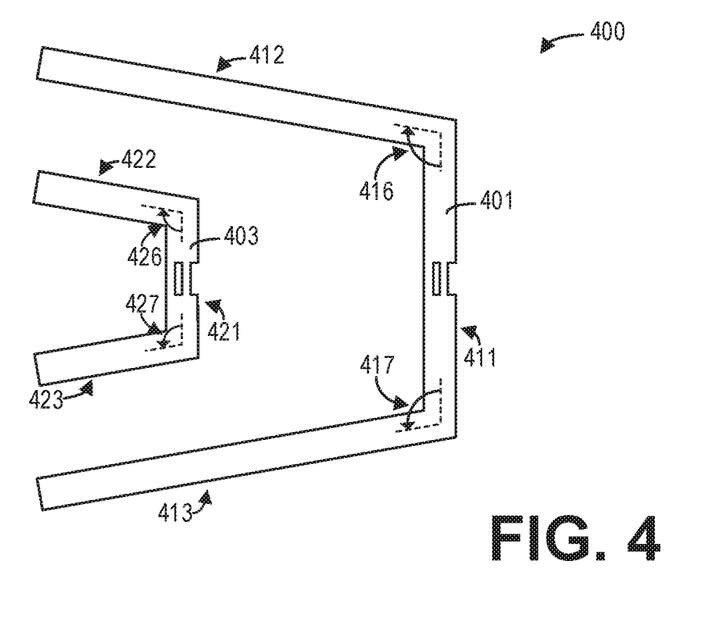
FIG. 4 illustrates an obtuse RF coil conductor configuration for an example RF coil according to an embodiment.
Figure 5:
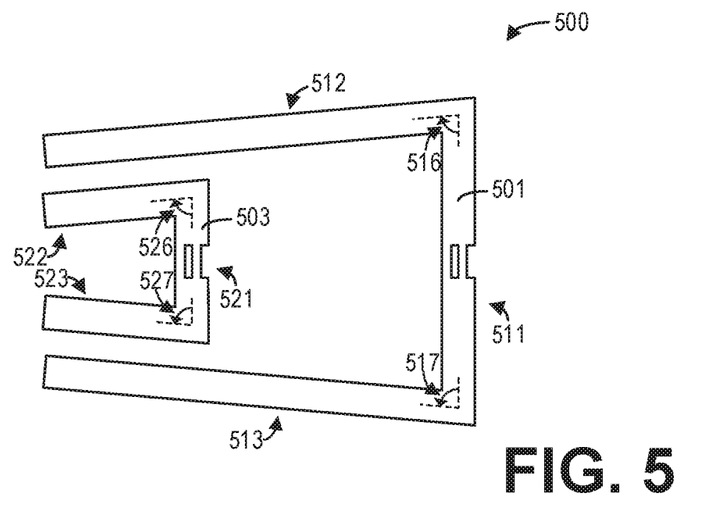
FIG. 5 illustrates an acute RF coil conductor configuration for an example RF coil according to an embodiment.

As depicted in FIGS. 2 and 3, the arms of the RF coil conductors extend from the base side of the RF coil conductors at right angles. That is, the arms form a ninety degree angle with the base side. It should be appreciated that the performance and efficiency of the RF coil 200 may be optimized or otherwise adjusted by adjusting the configuration of the RF coil conductors. As illustrative examples, FIGS. 4 and 5 depict different RF coil conductor configurations. Specifically, FIG. 4 illustrates an obtuse RF coil conductor configuration 400 for an example RF coil according to an embodiment. Outer RF coil conductor 401 comprises a base side 411 with a first arm 412 and a second arm 413 extending therefrom. As depicted, the first arm 412 extends from the base side 411 at an angle 416 greater than ninety degrees (e.g., an obtuse angle). Similarly, the second arm 413 extends from the base side 411 at an angle 417 greater than ninety degrees. In some examples, the angles 416 and 417 may comprise a same angle, though it should be appreciated that in other examples, the angles 416 and 417 may comprise different angles.

Similar to the outer RF coil conductor 401, the inner RF coil conductor 403 comprises a base side 421 with a first arm 422 and a second arm 423 extending therefrom. As depicted, the first arm 422 extends from the base side 421 at an angle 426 greater than ninety degrees. Similarly, the second arm 423 extends from the base side 421 at an angle 427 greater than ninety degrees.

As another illustrative example, FIG. 5 illustrates an acute RF coil conductor configuration 500 for an example RF coil according to an embodiment. Outer RF coil conductor 501 comprises a base side 511 with a first arm 512 and a second arm 513 extending therefrom. As depicted, the first arm 512 extends from the base side 511 at an angle 516 less than ninety degrees (e.g., an acute angle). Similarly, the second arm 513 extends from the base side 511 at an angle 517 less than ninety degrees.

Similar to the outer RF coil conductor 501, the inner RF coil conductor 503 comprises a base side 521 with a first arm 522 and a second arm 523 extending therefrom. The first arm 522 extends from the base side 521 at an angle 526 less than ninety degrees. The second arm 523 extends from the base side 521 at an angle 527 less than ninety degrees.

FIG. 6 shows a graph 600 illustrating magnetic field strength as a function of axial position (e.g., along the z axis) for different RF coils with a similar bore diameter (e.g., 68 cm to 70 cm). In particular, plot 605 depicts magnetic field strength as a function of axial position for an eight-channel staggered loop RF coil, such as the RF coil described hereinabove with regard to FIGS. 2-5; plot 610 depicts magnetic field strength as a function of axial position for a sixteen-channel TEM coil; plot 615 depicts magnetic field strength as a function of axial position for an eight-channel loop RF coil; and plot 620 depicts magnetic field strength as a function of axial position for a two-channel birdcage RF coil.

As depicted by plots 605 and 610, the field strength of the staggered loop RF coil is less than the field strength of the TEM coil away from the center of the coil. Meanwhile, the staggered loop RF coil is at least twice as efficient as the TEM coil.

Further, as depicted by plots 605, 615, and 620, the field strength of the staggered loop RF coil is smoother and greater than the field strength of the loop RF coil and the birdcage RF coil away from the center of the coil. The efficiency of the staggered loop RF coil is comparable to the two-channel birdcage coil, which is incapable of parallel transmission, and at least twice as efficient as the eight-channel loop coil.

Thus, the transmit and receive performance of the staggered loop RF coil is significantly improved over previous RF coil designs such as the loop, birdcage, and TEM designs. Channel isolation for the staggered loop RF coil is also substantially improved with respect to other RF coil designs. Furthermore, the staggered loop RF coil produces fewer annefact artifacts than the other coil designs.

FIGS. 2-5 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

In one embodiment, a radio frequency (RF) coil configured for a magnetic resonance imaging (MRI) system comprises a plurality of RF coil conductors, each RF coil conductor comprising a base side with two arms extending therefrom.

In a first example of the RF coil, the plurality of RF coil conductors includes a plurality of outer RF coil conductors and a plurality of inner RF coil conductors, wherein each of the plurality of inner RF coil conductors is positioned within a region defined by a corresponding outer RF coil conductor. In a second example of the RF coil optionally including the first example, the two arms of each inner RF coil conductor are aligned with the two arms of the corresponding outer RF coil conductor. In a third example of the RF coil optionally including one or more of the first and second examples, the RF coil further comprises a plurality of shields, wherein each RF coil conductor is positioned on an interior surface of a corresponding shield of the plurality of shields. In a fourth example of the RF coil optionally including one or more of the first through third examples, each RF coil conductor is fixedly attached to the interior surface of the corresponding shield via a plurality of posts. In a fifth example of the RF coil optionally including one or more of the first through fourth examples, the base side of each RF coil conductor includes at least one slot for receiving a tuning capacitor. In a sixth example of the RF coil optionally including one or more of the first through fifth examples, the two arms of each RF coil conductor of the plurality of RF coil conductors are oriented in a same direction. In a seventh example of the RF coil optionally including one or more of the first through sixth examples, the plurality of RF coil conductors are positioned in a staggered configuration along a circumference of the RF coil. In an eighth example of the RF coil optionally including one or more of the first through seventh examples, each RF coil conductor is coupled to at least one other RF coil conductor via a connecting strip. In a ninth example of the RF coil optionally including one or more of the first through eighth examples, the plurality of RF coil conductors comprises eight RF coil conductors.

In another embodiment, a system comprises: a superconducting magnet, a gradient coil assembly disposed within an inner diameter of the superconducting magnet, and a radio frequency (RF) coil disposed within an inner diameter of the gradient coil assembly, the RF coil comprising a plurality of RF coil conductors, each RF coil conductor comprising a base side with two arms extending therefrom.

In a first example of the system, the plurality of RF coil conductors includes a plurality of outer RF coil conductors and a plurality of inner RF coil conductors, wherein each of the plurality of inner RF coil conductors is positioned within a region defined by a corresponding outer RF coil conductor. In a second example of the system optionally including the first example, the RF coil further comprises a plurality of shields, wherein each RF coil conductor is positioned on an interior surface of a corresponding shield of the plurality of shields. In a third example of the system optionally including one or more of the first and second examples, the two arms of each RF coil conductor extend from the base side at one of a right angle, an acute angle, and an obtuse angle with respect to the base side. In a fourth example of the system optionally including one or more of the first through third examples, the RF coil comprises a whole body coil. In a fifth example of the system optionally including one or more of the first through fourth examples, the RF coil comprises a surface coil.

In yet another embodiment, a radio frequency (RF) coil comprises: a plurality of outer RF coil conductors, each outer RF coil conductor comprising a base side with two arms extending therefrom in a same direction, the base side and the two arms defining an interior region; and a plurality of inner RF coil conductors, each inner RF coil conductor comprising a base side with two arms extending therefrom in the same direction, wherein each inner RF coil conductor is positioned within the interior region of a corresponding outer RF coil conductor.

In a first example of the RF coil, the RF coil further comprises a plurality of shields, wherein each of the plurality of outer RF coil conductors and the plurality of inner RF coil conductors are positioned on an interior surface of a corresponding shield of the plurality of shields. In a second example of the RF coil optionally including the first example, the plurality of shields comprises a plurality of outer shields and a plurality of inner shields, wherein the plurality of outer RF coil conductors are positioned on the plurality of outer shields, wherein the plurality of inner RF coil conductors are positioned on the plurality of inner shields, wherein each of the outer shields are shaped similarly to the outer RF coil conductors, and wherein each of the inner shields are shaped as curved sheets. In a third example of the RF coil optionally including one or more of the first and second examples, the two arms of each inner RF coil conductor are aligned with the two arms of the corresponding outer RF coil conductor, and wherein each of the inner and the outer RF coil conductors are oriented in a same direction along a circumference of the RF coil.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A radio frequency (RF) coil configured for a magnetic resonance imaging (MRI) system, comprising:
   a plurality of RF coil conductors, each RF coil conductor comprising a base side with two arms extending therefrom;
   wherein the plurality of RF coil conductors includes a plurality of outer RF coil conductors and a plurality of inner RF coil conductors, wherein each of the plurality of inner RF coil conductors is positioned within a region defined by a corresponding outer RF coil conductor;
   wherein the two arms of each inner RF coil conductor are aligned with the two arms of the corresponding outer RF coil conductor;
   wherein all of the arms of the plurality of RF coil conductors are oriented in the same direction;
   wherein the conductors are U-shaped; and
   wherein the base side of each RF coil conductor includes at least one slot for receiving a tuning capacitor.

2. The RF coil of claim 1, further comprising a plurality of shields, wherein each RF coil conductor is positioned on an interior surface of a corresponding shield of the plurality of shields.

3. The RF coil of claim 2, wherein each RF coil conductor is fixedly attached to the interior surface of the corresponding shield via a plurality of posts.

4. The RF coil of claim 1, wherein the plurality of RF coil conductors are positioned in a staggered configuration along a circumference of the RF coil.

5. The RF coil of claim 1, wherein each RF coil conductor is coupled to at least one other RF coil conductor via a connecting strip.

6. The RF coil of claim 1, wherein the plurality of RF coil conductors comprises eight RF coil conductors.

7. A system, comprising:
a superconducting magnet;
a gradient coil assembly disposed within an inner diameter of the superconducting magnet; and
a radio frequency (RF) coil disposed within an inner diameter of the gradient coil assembly, the RF coil comprising:
a plurality of RF coil conductors, each RF coil conductor comprising a base side with two arms extending therefrom;
wherein the plurality of RF coil conductors includes a plurality of outer RF coil conductors and a plurality of inner RF coil conductors, wherein each of the plurality of inner RF coil conductors is positioned within a region defined by a corresponding outer RF coil conductor;
wherein the two arms of each inner RF coil conductor are aligned with the two arms of the corresponding outer RF coil conductor;
wherein the conductors are U-shaped; and
wherein the base side of each RF coil conductor includes at least one slot for receiving a tuning capacitor.

8. The system of claim 7, wherein the RF coil further comprises a plurality of shields, and wherein each RF coil conductor is positioned on an interior surface of a corresponding shield of the plurality of shields.

9. The system of claim 7, wherein the two arms of each RF coil conductor extend from the base side at one of a right angle, an acute angle, and an obtuse angle with respect to the base side.

10. The system of claim 7, wherein the RF coil comprises a whole body coil.

11. The system of claim 7, wherein the RF coil comprises a surface coil.

12. A radio frequency (RF) coil, comprising:
a plurality of outer RF coil conductors, each outer RF coil conductor comprising a base side with two arms extending therefrom in a same direction, the base side and the two arms defining an interior region;
a plurality of inner RF coil conductors, each inner RF coil conductor comprising a base side with two arms extending therefrom in the same direction, wherein each inner RF coil conductor is positioned within the interior region of a corresponding outer RF coil conductor; and
a plurality of shields, wherein each of the plurality of outer RF coil conductors and the plurality of inner RF coil conductors is positioned on an interior surface of a corresponding shield of the plurality of shields;
wherein the plurality of shields comprises a plurality of outer shields and a plurality of inner shields, wherein the plurality of outer RF coil conductors is positioned on the plurality of outer shields, wherein the plurality of inner RF coil conductors is positioned on the plurality of inner shields, wherein each of the outer shields is shaped similarly to the outer RF coil conductors, and wherein each of the inner shields is shaped as curved sheets.

13. The RF coil of claim 12, wherein the two arms of each inner RF coil conductor are aligned with the two arms of the corresponding outer RF coil conductor, and wherein each of the inner and the outer RF coil conductors are oriented in a same direction along a circumference of the RF coil.

14. The radio frequency coil of claim 1, wherein the arms extend from the base side at least one of an acute angle and an obtuse angle.

15. The RF coil of claim 12, wherein the arms extend from the base side at least one of an acute angle and an obtuse angle.

* * * * *